(12) United States Patent
Lee et al.

(10) Patent No.: US 6,653,047 B2
(45) Date of Patent: Nov. 25, 2003

(54) PHOTORESIST MONOMERS CONTAINING FLUORINE-SUBSTITUTED BENZYLCARBOXYLATE AND PHOTORESIST POLYMERS COMPRISING THE SAME

(75) Inventors: Geun Su Lee, Kyoungki-do (KR); Jae Chang Jung, Kyoungki-do (KR); Ki Soo Shin, Kyoungki-do (KR)

(73) Assignee: Hynix Semiconductor Inc, Kyoungki-do (KR)

( * ) Notice: Subject to any disclaimer, the term of this patent is extended or adjusted under 35 U.S.C. 154(b) by 29 days.

(21) Appl. No.: 10/107,650

(22) Filed: Mar. 27, 2002

(65) Prior Publication Data

US 2003/0017412 A1 Jan. 23, 2003

(30) Foreign Application Priority Data

Jun. 21, 2001 (KR) ........................................ 2001-35468

(51) Int. Cl.$^7$ .................. G03F 7/004; C08F 36/00; C08F 26/06; C08F 34/02; C07C 69/74
(52) U.S. Cl. .................. 430/270.1; 430/326; 430/905; 526/219.6; 526/227; 526/232.1; 526/251; 526/245; 526/262; 526/271; 526/281; 560/120
(58) Field of Search .................. 560/120; 526/281, 526/271, 262, 251, 245, 219.6, 227, 232.1; 430/270.1, 326, 905

(56) References Cited

U.S. PATENT DOCUMENTS

| | | | |
|---|---|---|---|
| 5,674,947 A | * | 10/1997 | Oishi et al. .................. 525/289 |
| 2001/0014427 A1 | * | 8/2001 | Suwa et al. |
| 2002/0015912 A1 | * | 2/2002 | Roh et al. |

FOREIGN PATENT DOCUMENTS

JP  04063810  * 2/1992

OTHER PUBLICATIONS

Chemical Abstract DN 117:49447 for JP 040638, Feb. 1992.*

* cited by examiner

Primary Examiner—Rosemary Ashton
(74) Attorney, Agent, or Firm—Marshall, Gerstein & Borun LLP

(57) ABSTRACT

Photoresist monomers, photoresist polymers prepared therefrom, and photoresist compositions using the polymers are disclosed. More specifically, photoresist polymers comprising a photoresist monomer containing fluorine-substituted benzylcarboxylate represented by Formula 1, and a composition comprising the polymer are disclosed. The photoresist composition has excellent etching resistance, heat resistance and adhesiveness, and can be developed in aqueous tetramethylammonium hydroxide (TMAH) solution. And, the present photoresist composition is suitable to form a fine pattern using deep ultraviolet light source such as VUV (157 nm), since the composition has low light absorbance at 193 nm and 157 nm wavelength.

Formula 1

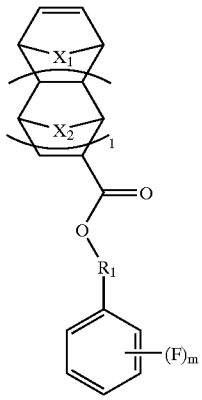

wherein, $X_1$, $X_2$, $R_1$, l and m are defined in the specification.

21 Claims, 5 Drawing Sheets

PHOTORESIST MONOMERS CONTAINING FLUORINE-SUBSTITUTED BENZYLCARBOXYLATE AND PHOTORESIST POLYMERS COMPRISING THE SAME

BACKGROUND

1. Technical Field

Novel photoresist monomers, polymers thereof and photoresist compositions containing the same are disclosed. In particular, photoresist polymers suitable for a photolithography process using DUV (deep ultraviolet) light source, such as VUV (157 nm) in fabricating a minute circuit for a highly integrated semiconductor device, photoresist compositions containing the same, and preparing process therefor are disclosed.

2. Description of the Related Art

A photoresist for an ArF and VUV (vacuum ultraviolet) should have low absorbency at 193 nm and 157 nm wavelengths, excellent etching resistance and adhesiveness on a substrate, and should be easily developable in a commercially available developing solution, such as aqueous tetramethylammonium hydroxide (TMAH) solution of 2.38 wt % or 2.6 wt %.

Much research has been conducted on resins having the high transparency at 248 nm and 193 nm wavelengths, and etching resistance similar to Novolac resins. However, most of the resists are not suitable for VUV due to their high absorbency at 157 nm wavelength. Other research on photoresists containing fluorine and silicon has been conducted to solve the above problem. However, most polyethylene or polyacrylate polymers containing fluorine have weak etching resistance, low solubility in an aqueous TMAH solutions and poor adhesiveness to the silicon wafer. In addition, these photoresists are difficult to mass-produce and are expensive.

SUMMARY OF THE DISCLOSURE

Photoresist monomers containing a benzylcarboxylate substituted with fluorine are disclosed.

Photoresist polymers containing the above photoresist monomers are also disclosed.

Photoresist compositions containing the photoresist polymers described above and processes for forming a photoresist patterns are also disclosed.

Semiconductor elements produced using the photoresist compositions described above are also disclosed.

DETAILED DESCRIPTION OF THE PRESENTLY PREFERRED EMBODIMENTS

Figure 1:
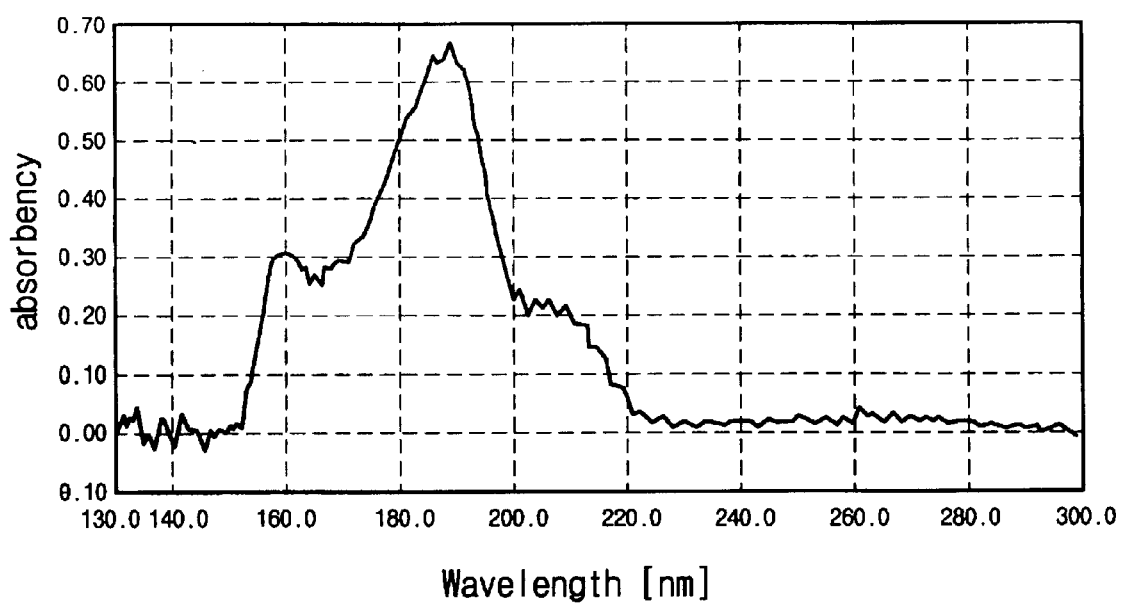
FIG. 1 is a VUV spectrum for the photoresist compositions of the present invention.

Photoresist monomers containing benzylcarboxylate substituted with fluorine having high etching resistance are represented by the following Formula 1.

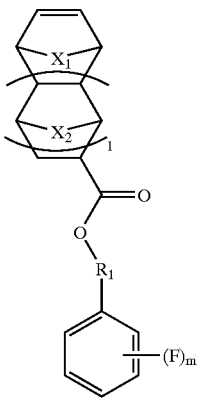

Formula 1 wherein, $R_1$ is substituted or unsubstituted linear or branched ($C_1$–$C_{10}$) alkylene or substituted or unsubstituted linear or branched ($C_1$–$C_{10}$) alkylene containing an ether group (O); $X_1$ and $X_2$ individually represent $CH_2$, $CH_2CH_2$ or O; l is 0 or 1; and m is an integer ranging from 1 to 5.

One preferable example of the monomer represented by Formula 1 is 2,6-difluoro-1-methyl-5-norbornene-2-carboxylate.

Photoresist copolymers comprise repeating units comprising the monomer represented by above Formula 1.

The polymer may further comprise the monomer represented by the following Formula 2.

Formula 2 wherein, $Y_1$ and $Y_2$ individually represent H or halogen; Z is O, N—R or N—O—R; R is H, ($C_1$–$C_{10}$) alkyl or alkyl group substituted with halogen.

In addition, the polymer may further comprise at least one monomer represented by the following Formula 3 and Formula 4.

Formula 3 wherein, $R_2$ is ($C_1$–$C_{20}$) alkyl, perfluoroalkyl or alkyl partially substituted with fluorine; and n is 0 or 1.

Formula 4

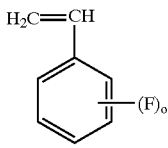

wherein, o is an integer ranging from 1 to 5.

Preferable examples of the photoresist polymer include repeating unit of the following Formula 5.

Formula 5

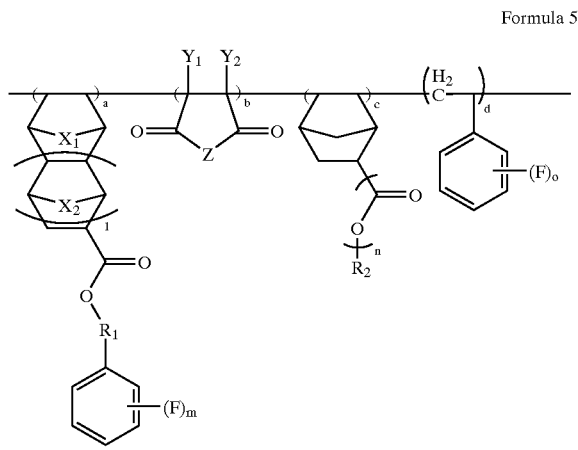

wherein $R_1$ is substituted or unsubstituted linear or branched ($C_1$–$C_{10}$) alkylene or substituted or unsubstituted linear or branched ($C_1$–$C_{10}$) alkylene containing ether group (—O—); $X_1$ and $X_2$ individually represent $CH_2$, $CH_2CH_2$ or O; $Y_1$ and $Y_2$ individually represent H or halogen; Z is O, N—R or N—O—R; R is H, ($C_1$–$C_{10}$) alkyl or alkyl group substituted with halogen; $R_2$ is ($C_1$–$C_{20}$) alkyl, perfluoroalkyl or alkyl partially substituted with fluorine; l and n individually represent 0 or 1; m and o are an integer ranging from 1 to 5; a:b:c:d is 10–50 mol %:10–50 mol %:0–40 mol %:0–40 mol %.

In the above Formula 5, wherein

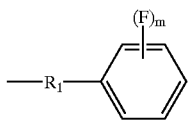

and $R_2$ individually play a role as acid labile protecting group.

The acid labile protecting group is the one that can be released by acid, which prevent the compound from dissolving in an alkaline developing solution. Some of conventional acid labile protecting group is bounded to polymer, the dissolution of photoresist material by alkaline developing solution is inhibited, while, in case that the acid labile protecting group is released by acid generated by light exposure, the photoresist material can be dissolved in developing solution. As the acid labile protecting group, any groups that can serve such a role may be used; the groups include what are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000) and U.S. Pat. No. 6,132,926 (Oct. 17, 2000).

Preferable examples of the repeating unit of Formula 5 include;

poly(maleic anhydride/4-fluorostyrene/2,6-difluoro-1-methylbenzyl-5-norbornene-2-carboxylate);

poly(N-methylmaleimide/hexafluorobutyl-5-norbornene-2-carboxylate/2,6-difluoro-1-methylbenzyl-5-norbornene-2-carboxylate);

poly(N-t-butoxymaleimide/2,6-difluorostyrene/2,6-difluoro-1-methylbenzyl-5-norbornene-carboxylate); and poly(N-methylmaleimide/2,6-difluoro-1-methylbenzyl-5-norbornene-2-carboxylate).

Polymer of the present invention can be prepared by additional polymerization of the comonomers.

In one particularly preferred method, the polymers of the present invention are prepared by the process comprising:

(a) admixing (i) a compound of Formula 1, (ii) a compound of Formula 2, and optionally (iii) at least one compound selected from the group consisting of Formula 3 and Formula 4; and (b) adding a polymerization initiator into the resultant to obtain the repeating unit of described above Formula 5.

The above polymerization may be performed by bulk or solution polymerization.

When solution polymerization is performed, the step (a) is preferably carried out in conventional organic solvent such as tetrahydrofuran, cyclohexanone, cyclopentanone, dimethylformamide, dimethylsulfoxide, dioxane, benzene, toluene, xylene, propylene glycol methyl ether acetate and mixtures thereof.

In addition, the polymerization initiators of the step (b) can be any conventional one, for example, 2,2'-azobisisobutyronitrile(AIBN), benzoylperoxide, acetylperoxide, laurylperoxide, tert-butylhydroperoxide, tert-butylperoxide or di-tert-butylperoxide.

Preferably, polymerization of the step (b) is carried out under an inert gas.

After polymerization, the polymers are subject to crystallization and/or purification by using petroleum ether, hexane, alcohols (methanol, ethanol, isopropanol and the like), water and mixtures thereof.

Photoresist composition comprise; i) a photoresist polymer described above; (ii) a photoacid generator; and (iii) an organic solvent.

Any of known photoacid generators, which is able to generate acids by light, can be used in photoresist composition of present invention. Conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000) and U.S. Pat. No. 6,132,926 (Oct. 17, 2000).

Preferred photoacid generators have relatively low absorbance in the wavelength of 157 nm and 193 nm. More preferred photoacid generator include sulfide or onium type compound. Specifically, photoacid generators are selected from the group consisting of phthalimidotrifluoromethane sulfonate, dinitrobenzyltosylate, n-decyl disulfone and naphthylimido trifluoromethane sulfonate.

The photoacid generator can further comprise a compound selected from the group consisting of diphenyliodide hexafluorophosphate, diphenyliodide hexafluoroarsenate, diphenyliodide hexafluoroantimonate, diphenyl-p-methoxyphenylsulfonium triflate, diphenyl-p-toluenylsulfonium triflate, diphenyl-p-isobutylphenylsulfonium triflate, triphenylsulfonium hexafluoroarsenate, triphenylsulfonium hexafluoroantimonate, triphenylsulfonium triflate and dibutylnaphthylsulfonium triflate.

The photoacid generator is used in an amount ranging from about 0.05 to about 10 wt % of the photoresist polymer employed.

It has been found that when the photoacid generator is used in the amount less than 0.05 wt %, it lowers photosensitivity of the photoresist composition, and when the photoacid generator is used in the amount of greater than about 10 wt %, it results in poor pattern formation due to its high absorption of DUV.

Organic solvent can be any of known solvent disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000) and U.S. Pat. No. 6,132,926 (Oct. 17, 2000)

Preferable organic solvents include methyl 3-methoxy propionate, ethyl 3-ethoxypropionate, propyleneglycol methyl ether acetate, cyclohexanone, 2-heptanone, ethyl lactate, diethyleneglycol diethyl ether or mixture thereof.

The amount of organic solvent ranges from about 500 to about 2000 wt % of the photoresist polymer to coat the photoresist in a wanted thickness. It has been found that when the amount of organic solvent is about 1000 wt % of the photoresist polymer, a photoresist layer having about 0.25 μm of thickness can be obtained.

The photoresist compositions containing repeating units have low absorbency and excellent etching resistance at 157 nm wavelength. The absorbency of the photoresist compositions when coated with 2500 Å thickness is 0.25 at 157 nm wavelength, which is about one-half of the absorbency of the general photoresist (see FIG. 1).

The former photoresist can been patterned at 157 nm wavelength, when coated with below a range of 600–700 Å thickness. But the photoresist compositions of the present invention can be patterned when coated with over 1200 Å thickness.

The photoresist compositions are obtained the photoresist pattern having excellent etching resistance and profile.

A process for forming a photoresist pattern comprises:

(a) coating the photoresist composition described above on a substrate to form a photoresist film;

(b) exposing the photoresist film to light; and (c) developing the photoresist film to form a photoresist pattern.

The process for forming the photoresist pattern can further include a soft baking step which is performed before the step (b) and/or a post baking step which is performed after the step (b). Preferably, the soft and post baking steps are performed at the temperature ranging from about 70 to about 200° C.

Exemplary light source which are useful for forming the photoresist pattern include KrF, ArF, E-beam, VUV, EUV, X-ray or ion beam.

I. Preparation of Photoresist Polymers

EXAMPLE 1

Synthesis of poly(maleic anhydride/4-fluorostyrene/
2,6-difluoro-1-methylbenzyl-5-norbornene-2-
carboxylate)

To 20 mL of tetrahydrofuran was added 50 mmole of maleic anhydride, 10 mmole of 4-fluorostyrene, 80 mmole of 2,6-difluoro-1-methylbenzyl-5-norbornene-2-carboxylate and 0.5 g of AIBN, and the resulting solution was reacted at about 65° C. for about 10 hours.

Thereafter, a polymer was precipitated in petroleum ether solution, filtered and dried in vacuo to obtain title compound (yield: 55%).

EXAMPLE 2

Synthesis of poly(N-methylmaleimide/
hexafluorobutyl-5-norbornene-2-carboxylate/2,6-
difluoro-1-methylbenzyl-5-norbornene-2-
carboxylate)

To 20 mL of tetrahydrofuran was added 50 mmole of N-methylmaleimide, 10 mmole of hexafluorobutyl-5-norbornene-2-carboxylate, 40 mmole of 2,6-difluoro-1-methylbenzylacrylate and 0.3 g of AIBN, and the resulting solution was reacted at about 65° C. for about 12 hours.

Thereafter, a polymer was precipitated in petroleum ether solution and filtered, thereby obtaining the polymer (yield: 51%).

EXAMPLE 3

Synthesis of poly(N-t-butoxymaleimide/2,6-
difluorostyrene/2,6-difluoro-1-methylbenzyl-5-
norbornene-2-carboxylate)

To 20 mL of tetrahydrofuran was added 50 mmole of N-t-butoxymaleimide, 10 mmole of 2,6-difluorostyrene, 50 mmole of 2,6-difluoro-1-methylbenzyl-5-norbornene-2-carboxylate and 0.5 g of AIBN, and the resulting solution was reacted at about 65° C. for about 12 hours.

Thereafter, a polymer was obtained in water/methanol solution and a polymer was precipitated in petroleum ether solution for 5 min, and filtered to obtain title compound (yield: 55%).

EXAMPLE 4

Synthesis of poly(N-methylmaleimide/2,6-difluoro-
1-methylbenzyl-5-norbornene-2-carboxylate)

To 20 mL of tetrahydrofuran was added 50 mmole of N-methylmaleimide, 50 mmole of 2,6-difluoro-1-methylbenzyl-5-norbornene-2-carboxylate and 0.50 g of AIBN, and the resulting solution was reacted at about 65° C. for about 12 hours.

Thereafter, a polymer was precipitated in water/methanol solution, filtered and dried in vacuo to obtain title compound (yield: 46%).

II. Preparation of Photoresist Composition and Formation of Patterns

EXAMPLE 5

To 20 g of propylene glycol methyl ether acetate (PGMEA) was added 2 g of the polymer of Example 1, 0.024 g of phthalimidotrifluoromethane sulfonate, and 0.06 g of triphenylsulfonium triflate. The resulting solution was filtered through 0.20 μm filter to obtain a photoresist composition.

Figure 2:
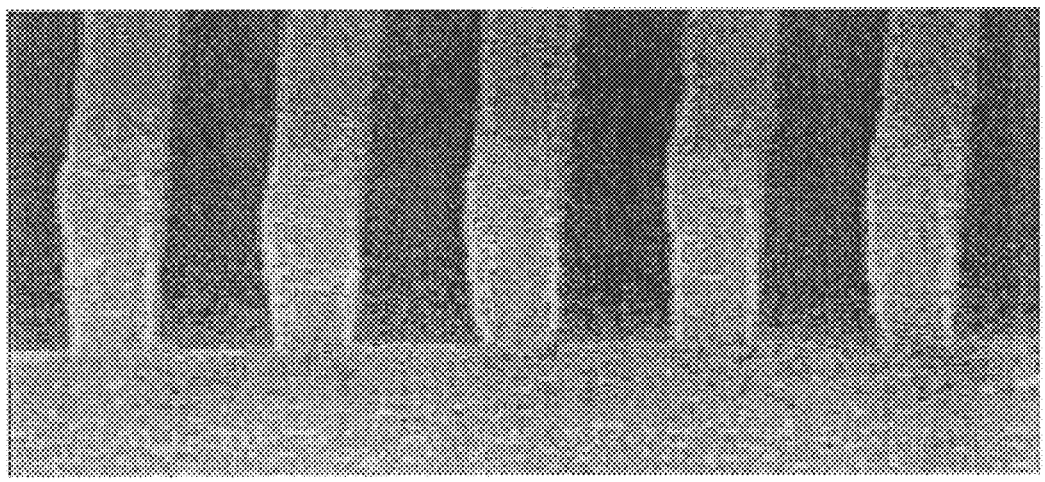
FIG. 2 is a photograph showing a pattern obtained in Example 5.

The photoresist composition thus prepared was spin-coated on silicon wafer to form a photoresist film, and soft-baked in an oven or hot plate of about 130° C. for about 90 seconds. After baking, the photoresist was exposed to light using a KrF laser exposer, and then post-baked at about 130° C. for about 90 seconds. When the post-baking was completed, it was developed in 2.38 wt % aqueous TMAH solution for about 40 seconds, to obtain 0.13 μm L/S pattern (see FIG. 2).

EXAMPLE 6

To 20 g of propylene glycol methyl ether acetate (PGMEA) was added 2 g of the polymer of Example 2, 0.024 g of phthalimidotrifluoromethane sulfonate, and 0.06 g of triphenylsulfonium triflate. The resulting solution was filtered through 0.20 μm filter to obtain a photoresist composition.

Figure 3:
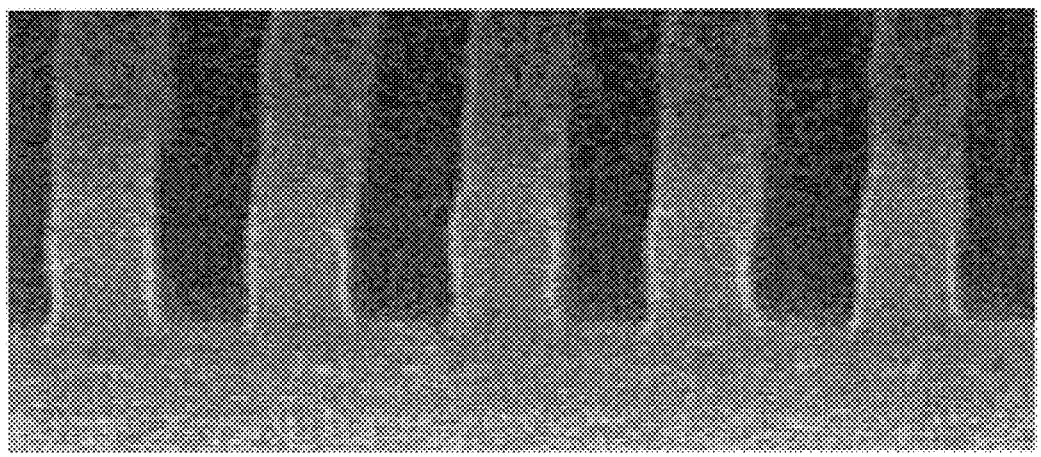
FIG. 3 is a photograph showing a pattern obtained in Example 6.

The photoresist composition thus prepared was spin-coated on silicon wafer to form a photoresist film, and soft-baked in an oven or hot plate of about 130° C. for about 90 seconds. After baking, the photoresist was exposed to light using a KrF laser exposer, and then post-baked at about 130° C. for about 90 seconds. When the post-baking was completed, it was developed in 2.38 wt % aqueous TMAH solution for about 40 seconds, to obtain 0.12 μm L/S pattern (see FIG. 3).

EXAMPLE 7

To 20 g of propylene glycol methyl ether acetate (PGMEA) was added 2 g of the polymer of Example 3, 0.024 g of phthalimidotrifluoromethane sulfonate, and 0.06 g of triphenylsulfonium triflate. The resulting solution was filtered through 0.20 μm filter to obtain a photoresist composition.

Figure 4:
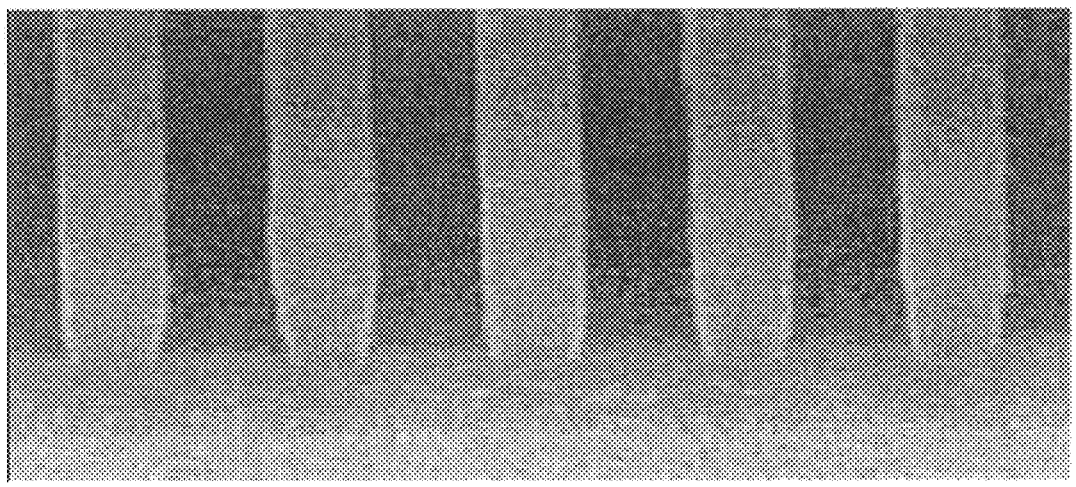
FIG. 4 is a photograph showing a pattern obtained in Example 7.

The photoresist composition thus prepared was spin-coated on silicon wafer to form a photoresist film, and soft-baked in an oven or hot plate of about 130° C. for about 90 seconds. After baking, the photoresist was exposed to light using a KrF laser exposer, and then post-baked at about 130° C. for about 90 seconds. When the post-baking was completed, it was developed in 2.38 wt % aqueous TMAH solution for about 40 seconds, to obtain 0.13 μm L/S pattern (see FIG. 4).

EXAMPLE 8

To 20 g of propylene glycol methyl ether acetate (PGMEA) was added 2 g of the polymer of Example 4, 0.024 g of phthalimidotrifluoromethane sulfonate, and 0.06 g of triphenylsulfonium triflate. The resulting solution was filtered through 0.20 μm filter to obtain a photoresist composition.

Figure 5:
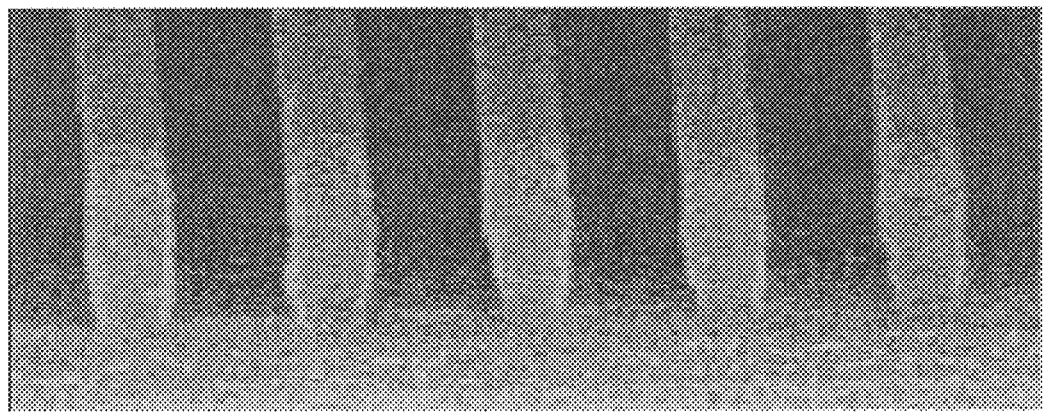
FIG. 5 is a photograph showing a pattern obtained in Example 8.

The photoresist composition thus prepared was spin-coated on silicon wafer to form a photoresist film, and soft-baked in an oven or hot plate of about 130° C. for about 90 seconds. After baking, the photoresist was exposed to light using a KrF laser exposer, and then post-baked at about 130° C. for about 90 seconds. When the post-baking was completed, it was developed in 2.38 wt % aqueous TMAH solution for about 40 seconds, to obtain 0.13 μm L/S pattern (see FIG. 5).

As discussed earlier, the photoresist pattern using the photoresist compositions of the present invention can be formed with excellent durability, etching resistance, reproducibility and resolution. In addition, the photoresist compositions can be used to form an ultrafine pattern of DRAM over 4 G and 16 G as well as DRAM below 1 G. Moreover, the photoresist polymer comprising fluorine has high light transmittance at a low wavelength, and thus is suitable for VUV.

What is claimed:

1. A photoresist monomer represented by following Formula 1:

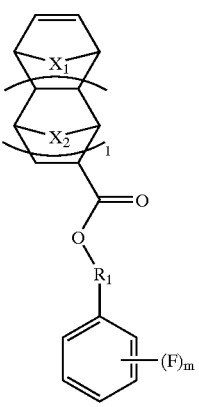

Formula 1 wherein, $R_1$ is $(C_1-C_{10})$ alkylene or $(C_1-C_{10})$ alkylene containing an ether group (—O—); $X_1$ and $X_2$ are individually selected from the group consisting of $CH_2$, $CH_2CH_2$ and O; l is 0 or 1; and m is an integer ranging from 1 to 5.

2. The photoresist monomer according to claim 1, wherein the compound of Formula 1 is 2,6-difluoro-1-methylbenzyl-5-norbornene-2-carboxylate.

3. A photoresist polymer comprising the photoresist monomer of claim 1.

4. The photoresist polymer according to claim 3, further comprising the co-monomer of the following Formula 2:

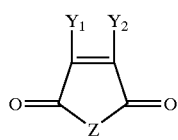

Formula 2 wherein $Y_1$ and $Y_2$ individually represent H or halogen; Z is O, N—R or N—O—R; R is selected from the group consisting of H, $(C_1-C_{10})$ alkyl and $(C_1-C_{10})$ alkyl group substituted with halogen.

5. The photoresist polymer according to claim 3, further comprising at least one monomer selected from the group consisting of following Formula 3 and Formula 4:

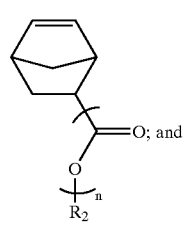

Formula 3

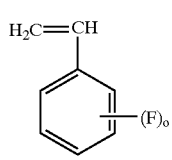

Formula 4 wherein, $R_2$ is selected from the group consisting of $(C_1-C_{20})$ alkyl, perfluoroalkyl and an alkyl partially substituted with fluorine; n is 0 or 1; and o is an integer ranging from 1 to 5.

6. A photoresist polymer comprising a repeating unit of the following Formula 5:

Formula 5

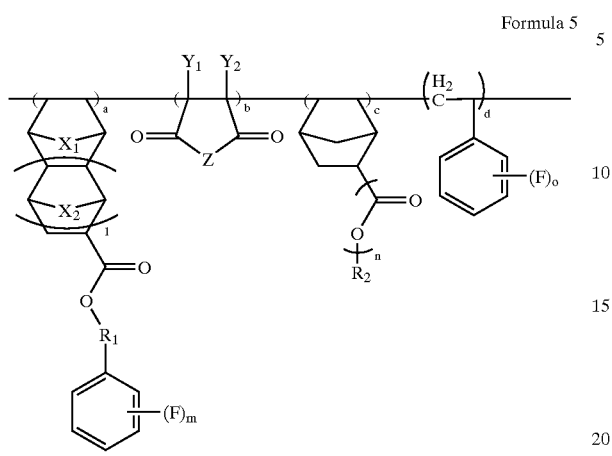

wherein, $R_1$ is $(C_1-C_{10})$ alkylene and $(C_1-C_{10})$ alkylene containing ether group (—O—); $X_1$ and $X_2$ are individually selected from the group consisting of $CH_2$, $CH_2CH_2$ and O; $Y_1$ and $Y_2$ individually represent H or halogen; Z is O, N—R or N—O—R; R is selected from the group consisting of H, $(C_1-C_{10})$ alkyl and an alkyl group substituted with halogen; $R_2$ is selected from the group consisting of $(C_1-C_{20})$ alkyl, perfluoroalkyl and alkyl partially substituted with fluorine; l and n individually represent 0 or 1; m and o are integers ranging from 1 to 5; and the ratio a:b:c:d falls within the ranges 10–50 mol %:10–50 mol %:0–40 mol %:0–40 mol %.

7. The photoresist polymer according to claim 6, wherein the repeating unit is selected from the group consisting of:

poly(maleic anhydride/4-fluorostyrene/2,6-difluoro-1-methylbenzyl-5-norbornene-2-carboxylate);

poly(N-methylmaleimide/hexafluorobutyl-5-norbornene-2-carboxylate/2,6-difluoro-1-methylbenzyl-5-norbornene-2-carboxylate);

poly(N-t-butoxymaleimide/2,6-difluorostyrene/2,6-difluoro-1-methylbenzyl-5-norbornene-carboxylate); and poly(N-methylmaleimide/2,6-difluoro-1-methylbenzyl-5-norbornene-2-carboxylate).

8. A process for preparing a photoresist polymer comprising:

(a) admixing (i) a compound of Formula 1, (ii) a compound of Formula 2, and optionally (iii) at least one compound selected from the group consisting of Formula 3 and Formula 4; and (b) adding a polymerization initiator into the resultant to obtain repeating unit of Formula 5:

Formula 1

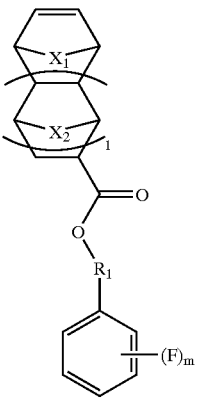

Formula 2

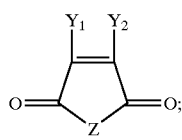

Formula 3

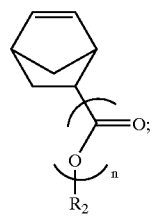

Formula 4

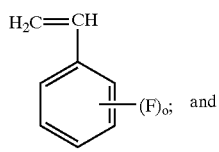

Formula 5

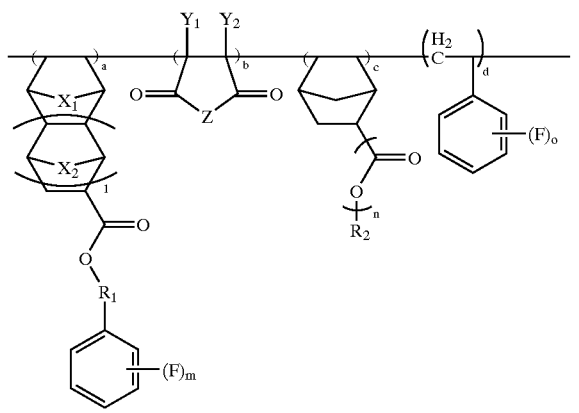

wherein, $R_1$ is $(C_1-C_{10})$ alkylene or $(C_1-C_{10})$ alkylene containing an ether group (—O—); $X_1$ and $X_2$ are individually selected from the group consisting of $CH_2$, $CH_2CH_2$ and O; $Y_1$ and $Y_2$ individually represent H or halogen; Z is O, N—R or N—O—R; R is selected from the group consisting of H, ($C_1$–$C_{10}$) alkyl and alkyl group substituted with halogen; $R_2$ is selected from the group consisting of ($C_1$–$C_{20}$)) alkyl, perfluoroalkyl and alkyl partially substituted with fluorine; l and n individually represent 0 or 1; m and o are an integer ranging from 1 to 5; and the ratio a:b:c:d falls within the ranges 10–50 mol %:10–50 mol %:0–40 mol %:0–40 mol %.

9. A process for preparing a photoresist polymer according to claim 8, wherein the step (a) is carried out in a polymerization solvent selected from the group consisting of tetrahydrofuran, cyclohexanone, cyclopentanone, dimethylformamide, dimethylsulfoxide, dioxane, benzene, toluene, xylene, propylene glycol methyl ether acetate and mixtures thereof.

10. A process for preparing a photoresist polymer according to claim 8, wherein the polymerization initiator is selected from the group consisting of 2,2'-azobisisobutyronitrile (AIBN), benzoylperoxide, acetylperoxide, laurylperoxide, tert-butylhydroperoxide, tert-butylperoxide and di-tert-butylperoxide.

11. A photoresist composition comprising:
(i) the photoresist polymer of claim 3;
(ii) an organic solvent; and
(iii) a photoacid generator.

12. The photoresist composition according to claim 11, wherein the photoacid generator is selected from the group consisting of phthalimidotrifluoromethane sulfonate, dinitrobenzyl tosylate, n-decyl disulfone and naphthyl imidotrifluoro methanesulfonate.

13. The photoresist composition according to claim 12, wherein the photoacid generator further comprises one or more compound(s) selected from the group consisting of diphenyl iodide hexafluorophosphate, diphenyliodide hexafluoroarsenate, diphenyliodide hexafluoroantimonate, diphenyl-p-methoxyphenylsulfonium triflate, diphenyl-p-toluenylsulfonium triflate, diphenyl-p-isobutylphenylsulfonium triflate, triphenylsulfonium hexafluoroarsenate, triphenylsulfonium hexafluoroantimonate, triphenylsulfonium triflate and dibutylnaphthylsulfonium triflate.

14. The photoresist composition according to claim 11, wherein the photoacid generator is used in an amount ranging from about 0.05 to about 10 wt % of the photoresist polymer.

15. The photoresist composition according to claim 11, wherein the organic solvent is selected from the group consisting of diethyleneglycol diethyl ether, ethyl 3-ethoxypropionate, methyl 3-methoxypropionate, cyclohexanone, propyleneglycol methyl ether acetate, 2-heptanone, ethyl lactate, cyclopentanone and mixtures thereof.

16. The photoresist composition according to claim 11, wherein the organic solvent is used in an amount ranging from about 500 to about 2000 wt % of said photoresist polymer.

17. A process for forming of a photoresist pattern comprising:
(a) coating the photoresist composition of claim 11 on a substrate to form a photoresist film;
(b) exposing the photoresist film to light; and
(c) developing the photoresist film to form a photoresist pattern.

18. The process according to claim 17, further comprising a soft baking step before step (b) and/or a post baking step after step (b).

19. The process according to claim 18, wherein the soft and post baking steps are individually performed at the temperature ranging from about 70 to about 200° C.

20. The process according to claim 17, wherein the source of light is selected from the group consisting of KrF, ArF, E-beam, VUV, EUV, X-ray and ion beam.

21. A semiconductor element manufactured according to the process of claim 17.

* * * * *